United States Patent

Terao et al.

[11] Patent Number: 6,133,581
[45] Date of Patent: Oct. 17, 2000

[54] ORGANIC LIGHT-EMITTING DEVICE AND METHOD OF MANUFACTURING THE SAME

[75] Inventors: Yutaka Terao; Yotaro Shiraishi; Makoto Utsumi, all of Kanagawa, Japan

[73] Assignee: Fuji Electric Co., Ltd., Kawasaki, Japan

[21] Appl. No.: 09/157,591

[22] Filed: Sep. 21, 1998

[30] Foreign Application Priority Data

Sep. 22, 1997 [JP] Japan .................................... 9-256694
Jun. 30, 1998 [JP] Japan .................................. 10-199861
Aug. 25, 1998 [JP] Japan .................................. 10-254520

[51] Int. Cl.$^7$ .......................... H01L 35/24; H01L 51/00; H01L 27/15; H01L 31/12; H01L 33/00
[52] U.S. Cl. .............................. 257/40; 257/79; 313/503; 313/504; 313/505
[58] Field of Search ................. 257/40, 79; 313/503–505

[56] References Cited

U.S. PATENT DOCUMENTS 5,399,936  3/1995  Namiki et al. ........................... 313/504
5,698,048  12/1997 Friend et al. ............................ 136/263

FOREIGN PATENT DOCUMENTS 2-253593   10/1990  Japan .
2329280    3/1999   United Kingdom .
97/47050   12/1997  WIPO .
97/47051   12/1997  WIPO .
98/10473   3/1998   WIPO .

*Primary Examiner*—David Hardy
*Assistant Examiner*—Allan R. Wilson
*Attorney, Agent, or Firm*—Kanesaka & Takeuchi

[57] ABSTRACT

An organic light-emitting device is formed of a transparent substrate, anodes in a stripe pattern formed on the transparent substrate, an organic film layer formed on the anodes, and cathodes formed on the organic film layer. Each of the anode includes a first conductor formed of a transparent and electrically conductive film containing a metal oxide as a main component, and a second conductor extending along the first conductor. The second conductor is formed of metal with a resistivity of $1/10$ or less than a resistivity of a constituent material of the first conductor. Thus, the organic light-emitting device emits light efficiently with a low power consumption.

9 Claims, 14 Drawing Sheets

ORGANIC LIGHT-EMITTING DEVICE AND METHOD OF MANUFACTURING THE SAME

BACKGROUND OF THE INVENTION AND RELATED ART STATEMENT

The present invention relates to an organic light-emitting device used for display devices, specifically, to an organic light-emitting device which can be driven by a low drive voltage with low power consumption. The present invention relates also to a method of manufacturing the organic light-emitting device.

FIG. 17(a) is a cross sectional view of a conventional organic light-emitting device including a binary organic film laminate, and FIG. 17(b) is a cross sectional view of another conventional organic light-emitting device including a ternary organic film laminate.

Referring now to these figures, the organic light-emitting device includes a transparent substrate 1, an anode 2 on the transparent substrate 1, an organic film laminate 3 on the anode 2, and a cathode 4 on the organic film laminate 3. The anode 2 is made of a transparent and conductive film. The cathode 4 is made of a metal film. In FIG. 17(a), the organic film laminate 3 consists of a hole transport layer 3h and a light-emitting layer 3r. In FIG. 17(b), the organic film laminate 3 consists of a hole transport layer 3h, a light-emitting layer 3r and an electron transport layer 3e. The hole transport layer 3h facilitates hole injection from the anode 2 to the light-emitting layer 3r and blocks electron injection. The electron transport layer 3e facilitates electron injection from the cathode 4 to the light-emitting layer 3r. A driving power supply E is connected to the anode 2 and the cathode 4. Arrows in FIGS. 17(a) and 17(b) indicate the directions of light emissions from the respective light-emitting devices. Recently, still another organic light-emitting device including a quaternary organic film laminate having a hole injection layer between the anode and the hole transport layer has been proposed.

Research and development of the organic light-emitting device have been conducted vigorously, since the organic light-emitting device exhibits excellent visibility due to the self-light-emitting nature thereof and the organic light-emitting device can be driven by a low voltage.

The mechanism for light-emission from the organic light-emitting device has been considered as follows. An electron injected from the cathode and a hole injected from the anode recombine in the vicinity of the boundary between the hole transport layer and the light-emitting layer, and an exciton is generated. Light is radiated during the radiative deactivation of the exciton. The light is radiated outside through the anode, that is a transparent and electrically conductive film, and the transparent substrate.

The organic light-emitting device of a simple matrix type (hereinafter sometimes referred to as "passive matrix type") has the simplest structure which includes many picture elements. FIG. 18(a) is a top plan view of a conventional organic light-emitting device of simple matrix type. FIG. 18(b) is a sectional view taken along line 18(b)—18(b) in FIG. 18(a). FIG. 18(c) is a partly-broken perspective view of the conventional organic light-emitting device of FIG. 18(a).

The passive-matrix-type device includes anodes 2 consisting of strips extending parallel to each other on a transparent substrate 1, cathodes 4 consisting of strips extending perpendicularly to the anode strips, and an organic film layer 3 between the electrodes 2 and 4. An area where a strip of the anode 2 and a strip of the cathode 4 cross each other is one unit of a light-emitting area, that is one picture element. A plurality of the picture elements is arranged in a display area D. The peripheral area of the substrate where the anode strips and the cathode strips are extended outwardly from the display area D is a connection area C. A display device is constructed by connecting the display area D to an external drive circuit via the connection area C. Therefore, the anodes 2 and the cathodes 4 work also as the wirings.

In these days, it has been required for the display devices to have a wider display screen and a much finer structure. To meet these recent requirements, the wirings in the display area of the organic light-emitting device are becoming longer and finer. Usually, a metal oxide, such as indium tin oxide (hereinafter referred to as "ITO") and indium zinc oxide (hereinafter referred to as "IZO"), is used for the anode. Also, a metallic material, such as Al and aluminum alloys, is used for the cathode. The resistivity of the metal oxide is higher than that of aluminum and so on. Although it is possible to lower the wiring resistance of the transparent conductive film by increasing the thickness thereof, it is not desirable to reduce the transparency of the transparent conductive film by increasing the thickness thereof. Therefore, the wiring resistance of the transparent conductive film for the anode tends to be higher. A higher drive voltage necessary for compensating the voltage drop across the high wiring resistance of the anode in driving the display panel causes more power consumption. Since the joule heat generated from the wirings heats the organic layer, the properties of the organic light-emitting device are deteriorated and the life of the organic light-emitting device is shortened.

Japanese Unexamined Laid Open Patent Publications No. H05-307997 and No. H06-5369 disclose a lamination of a transparent conductive film and a metal film for reducing the resistance of the anode.

Japanese Unexamined Laid Open Patent Publication No. H05-307997 describes that the metal film interposed partially between the anode and the hole transport layer has a work function smaller than that of the anode. Japanese Unexamined Laid Open Patent Publication No. H06-5369 describes that the anode consists of a transparent first anode portion and a second anode portion contacting with the hole transport layer and having a work function larger than that of the first anode portion. Thus, the wiring resistance is reduced by laminating the metal film to the anode, and the power consumption efficiency of the display device is improved by utilizing the work function of the metal film, so that controlled carrier injection from the anode to the organic film laminate may be facilitated.

Japanese Unexamined Laid Open Patent Publication No. H06-5369 discloses a lamination of a very thin film of a material exhibiting a high hole injection efficiency so that the transparency thereof is 90% or more. Ni, Se, Pd, Ir, Pt and Au are described as examples of the materials which exhibit a high hole injection efficiency. In manufacturing the device, an Au film of 2 nm in thickness or a Pt film of 2 nm in thickness is deposited on the entire upper surface of an ITO film of 100 nm in thickness. As a result, the drive voltage is lowered, and the light-emission efficiency of the device is improved from 3.0 lm/W to 3.2 lm/W and 3.6 lm/W, respectively.

Although no clear descriptions have been made on the wiring resistance, the very thin metal film of around 2 nm in thickness usually has an island structure. Since the very thin metal film is not uniform due to the island structure, the resistivity of the very thin metal film tends to be higher than that of the metal film which is thick enough. Therefore, the wiring resistance is not reduced sufficiently when the display area is wide or when the display area includes many picture elements.

Although it is necessary to thicken the metal film for reducing the wiring resistance, the thickening of the metal film is not always effective, since the transparency for the visible light is reduced and the light-emitting efficiency of the device is lowered.

According to Japanese Unexamined Laid Open Patent Publication No. H05-307997, the anode is constructed by laminating a metal film, which has a work function smaller than that of the transparent conductive film, on a part of the transparent conductive film.

The metal film having a small work function partially blocks the hole injection and reduces a current pertinent to the emission of light which is not radiated outside. When the work function of the metal is the same as or larger than that of the transparent conductive film, light is emitted by the hole injection to the organic layer due to the hole injection capability of the metal. Since the metal film works as a shield film, the emitted light is not radiated outside and power consumption increases due to the light emission loss. However, since electrons are injected easily from the metal film with a small work function, cross talk may be caused by the light emitted even when a reverse bias voltage is applied to stop the light emission. When a metal film is disposed partly underneath the transparent conductive film, current loss is also caused, since the metal film works as a shield film.

In the examples as disclosed in Japanese Publication No. H05-307997, combinations of materials having a large work function, such as ITO film (work function is about 5.0 eV), with metals, which have the work functions of 4.3 eV or smaller, such as Al, Mg, In and Ag, their alloys and appropriate combinations of these metals and alloys, are described. It is said that using metal with a smaller work function is preferable.

However, it has been known that when Al for the metal and ITO for the transparent conductive film are used, the ITO film and the Al film are corroded in the photolithographic process, that is the development process of the photoresist which uses an Al mask for etching, and the reliability of the electrodes is greatly lowered (cf. H. Nishino et al., Sharp Technical Report, Vol. 44 (1990), pp. 31–36).

The same phenomena are observed when an aluminum alloy is used. It is considered that the foregoing phenomena are caused by the formation of a local cell, wherein materials with the large difference in the work function work as positive and negative electrodes and a developing agent, e.g. TMAH (($CH_3)_4NO$ solution), works as an electrolyte solution.

Therefore, the foregoing phenomena may be caused not only in the development process of the photoresist but also in the wet etching process of the electrode materials when the materials with the large difference in the work function are laminated.

Therefore, it is highly possible that the material combinations exemplary described in Japanese Unexamined Laid Open Patent Publication No. H05-307997 cause corrosion of the transparent conductive film and the metal film. Corrosion of the transparent conductive film and the metal film should be taken into account also when a material having a work function larger than that of the transparent conductive film is combined with the transparent conductive film.

In view of the foregoing, it is an object of the invention to provide an organic light-emitting device which obviates the foregoing problems.

It is another object of the invention to provide an organic light-emitting device, wherein a wiring resistance of an anode is small, a light-emitting efficiency thereof is high, and a power consumption thereof is small.

It is a further object of the invention to provide an organic light-emitting device which does not cause illuminance deviation by a voltage drop, does not emit light under a reverse bias voltage, and, therefore, prevents cross talks.

It is a still further object of the invention to provide a method of manufacturing such the organic light-emitting devices with high throughput.

SUMMARY OF THE INVENTION

According to one aspect of the invention, there is provided an organic light-emitting device which includes a transparent substrate; anodes formed on the transparent substrate and formed in a stripe pattern; an organic film layer or laminate on the anodes; cathodes on the organic film laminate, wherein each anode is formed of a first conductor and a second conductor; the first conductor includes a transparent and electrically conductive film containing a metal oxide as a main component thereof; and the second conductor extends along the first conductor and contains a metal, the resistivity of the second conductor being $\frac{1}{10}$ or less than the resistivity of the constituent material of the first conductor.

Advantageously, the second conductor is formed between the transparent substrate and the first conductor.

The second conductor may be formed between the first conductor and the organic film laminate, and the surface of the second conductor on the side of the organic film layer is covered with a metal oxide film.

Advantageously, the metal oxide film is an oxidation product of the second conductor.

Advantageously, the second conductor is formed between the first conductor and the organic film laminate, and the second conductor includes a metal having a work function of 4.8 eV or higher.

According to another aspect of the invention, there is provided an organic light-emitting device which includes anodes formed in a stripe pattern; insulation films on the anodes; an organic film layer or laminate on the insulation films; cathodes on the organic film laminate, wherein each anode includes a first conductor and a second conductor; the first conductor includes a transparent and electrically conductive film containing a metal oxide as the main component thereof; the second conductor includes one or more metal films; and the insulation film is interposed between the second conductor and the organic film laminate.

Advantageously, the second conductor is a laminate including a plurality of metal films.

Advantageously, the difference between a work function of the material constituting the first conductor, and a work function of the metal of the metal film, which is positioned most closely to the organic film laminate, of the second conductor is 0.5 eV or less.

Advantageously, the insulation film is an oxide film of the material constituting the second conductor.

According to a further aspect of the invention, there is provided a method of manufacturing the organic light-emitting device which includes an anode including a first conductor and a second conductor, an insulation film, an organic film layer or laminate, and a cathode on the organic film layer, the insulation film being interposed between the second conductor and the organic film laminate, wherein the method includes the steps of: forming the anode; and then forming the insulation film.

Advantageously, the insulation film is formed by oxidizing the surface of the second conductor.

DETAILED DESCRIPTION OF PREFERRED EMBODIMENTS

Now, the present invention will be explained hereinafter with reference to the accompanied drawings.

Figure 1:
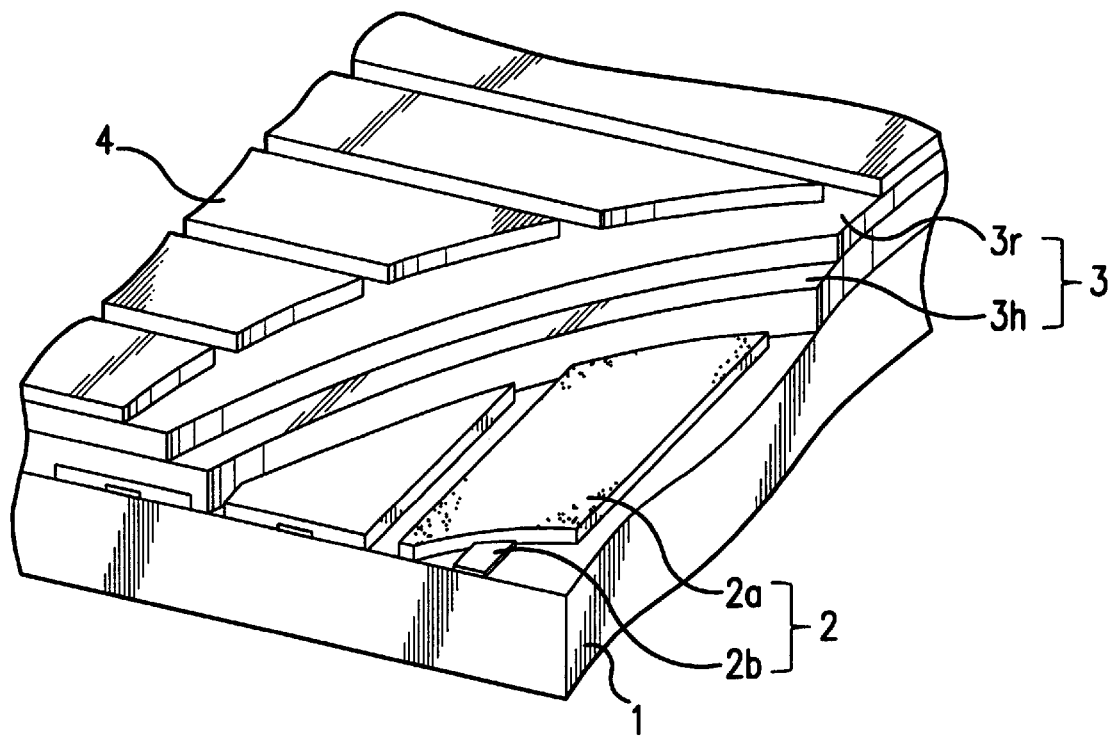
FIG. 1 is a partially broken perspective view of a simple-matrix-type organic light-emitting device which includes a second conductor according to the invention.

FIG. 1 is a partially broken perspective view of a simple-matrix-type organic light-emitting device which includes a second conductor according to the invention. Referring now to FIG. 1, the simple-matrix-type organic light-emitting device according to the invention includes a substrate 1, metal second conductors or strips 2b formed on the substrate 1 in a stripe pattern, first conductors 2a made of a transparent and electrically conductive material and formed in a stripe pattern for covering the second conductors 2b, an organic film laminate 3 formed on the strips of the first conductors 2a, and metal cathodes 4 on the organic film laminate 3 and formed in a stripe pattern extending perpendicularly to the strips of the anodes 2. The organic film laminate 3 has a binary layer structure which includes a hole transport layer 3h on the anode side and a light-emitting layer 3r on the hole transport layer 3h. An electron transport layer may be laminated on the light-emitting layer 3r.

Figure 2:
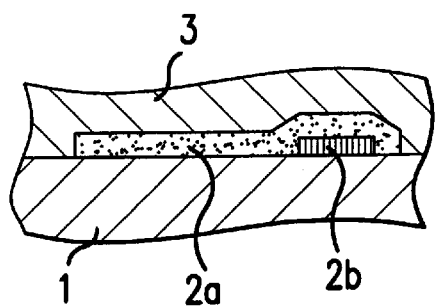
FIG. 2 is a cross sectional view of an anode of the organic light-emitting device showing another arrangement of the second conductor according to the invention.

The second conductor 2b may be arranged on a different position of the first conductor 2a. FIG. 2 is a cross sectional view of the anode of the organic light-emitting device showing another arrangement of the metal second conductor according to the invention. Referring now to FIG. 2, a second conductor 2b is arranged below the peripheral portion of a first conductor 2a.

By selecting the material for the second conductor 2b such that the resistivity thereof is $\frac{1}{10}$ or less than that of the transparent conductive material for the first conductor 2a, the resistance of the anode is reduced. And, obstacles against light emission to the outside is reduced by setting the width of the second conductor 2b to be narrower than that of the first conductor 2a. Thus, the voltage drop along the anode is small in driving the device. Therefore, it is expected that the illuminance drop along the anode is small. Since the second conductor 2b covered by the first conductor 2a does not contact the organic film laminate, electrons are not injected from the second conductor 2b to the organic film laminate and the picture elements connected to the anode never emit light when a reverse bias voltage is applied. That is, it is expected that cross talk will never be caused.

Figure 3:
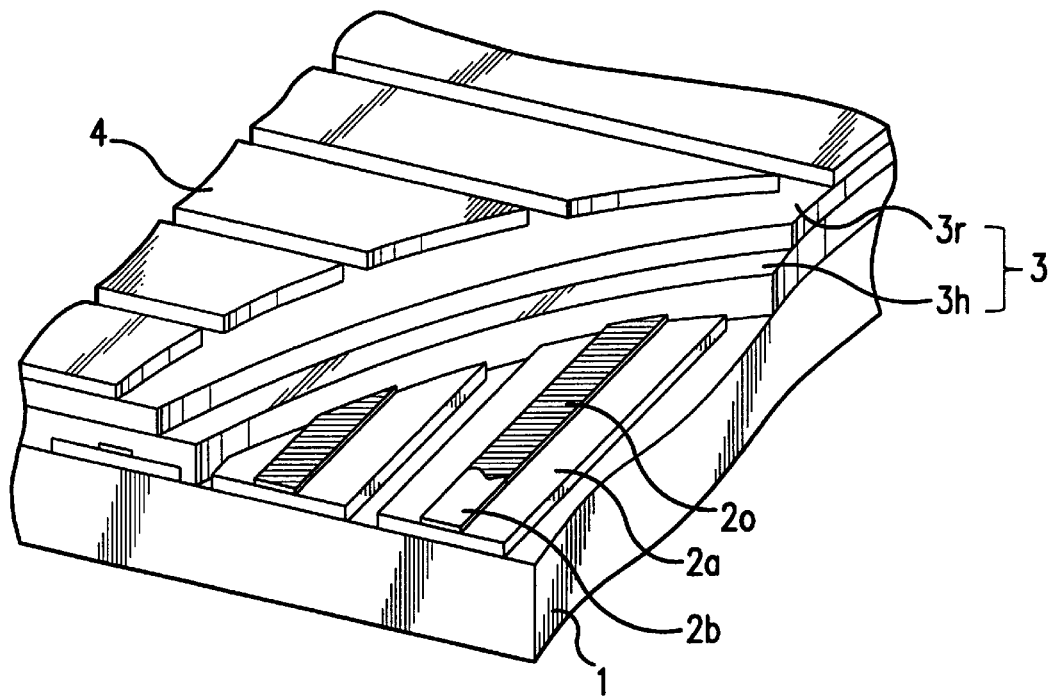
FIG. 3 is a partially broken perspective view of another simple-matrix-type organic light-emitting device which includes a second conductor covered with an oxide film according to the invention.

FIG. 3 is a partially broken perspective view of another simple-matrix-type organic light-emitting device which includes a metal second conductor covered with an oxide film according to the invention. Since the organic light-emitting device of FIG. 3 has a structure similar to that of the organic light-emitting device of FIG. 1 except a portion around the metal second conductor, only the portion of the metal second conductor will be explained with reference to FIG. 3. In FIG. 3, a metal second conductor 2b is formed between a first conductor 2a and an organic film laminate 3. An oxide film 2o is formed on the surface of the metal second conductor 2b on the side of the organic film laminate 3. Metals, such as Al, Cu, Mo and W, and alloys, such as Al-Si, Al-Ta and Al-Nd, may be used for the metal second conductor 2b.

The oxide film 2o is formed by exposing the substrate 1 with the metal second conductor 2b formed thereon to an ozone atmosphere or to oxygen plasma. The oxide film 2*o* may be formed also by anodic oxidation.

Figure 4A:
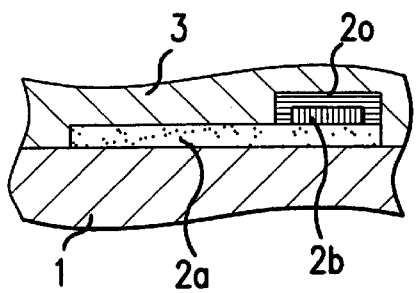
FIG. 4(a) is a cross sectional view of the anode showing another arrangement of the second conductor of FIG. 3.
Figure 4B:
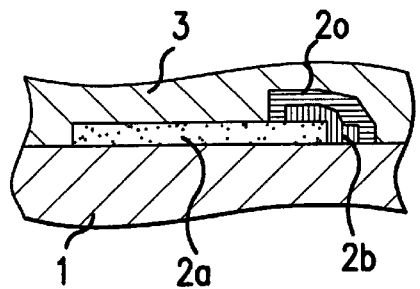
FIG. 4(b) is a cross sectional view of the anode showing still another arrangement of the second conductor of FIG. 3.

The metal second conductor 2*b* may be located on the other position of the first conductor 2*a* as far as the function of the metal second conductor 2*b* are not impaired. FIG. 4(*a*) is a cross sectional view of the anode showing another arrangement of the metal second conductor of FIG. 3. FIG. 4(*b*) is a cross sectional view of the anode showing still another arrangement of the metal second conductor of FIG. 3. In FIG. 4(*a*), the metal second conductor 2*b* is laminated on an edge portion of the first conductor 2*a*. In FIG. 4(*b*), the metal second conductor 2*b* is laminated partly on an edge portion of the first conductor 2*a*.

In FIGS. 4(*a*) and 4(*b*), the resistance is reduced by the metal second conductor 2*b* in the same manner as described above, and the oxide film 2*o* prevents electron injection. Therefore, the same effects with those described above are expected.

Figure 5:
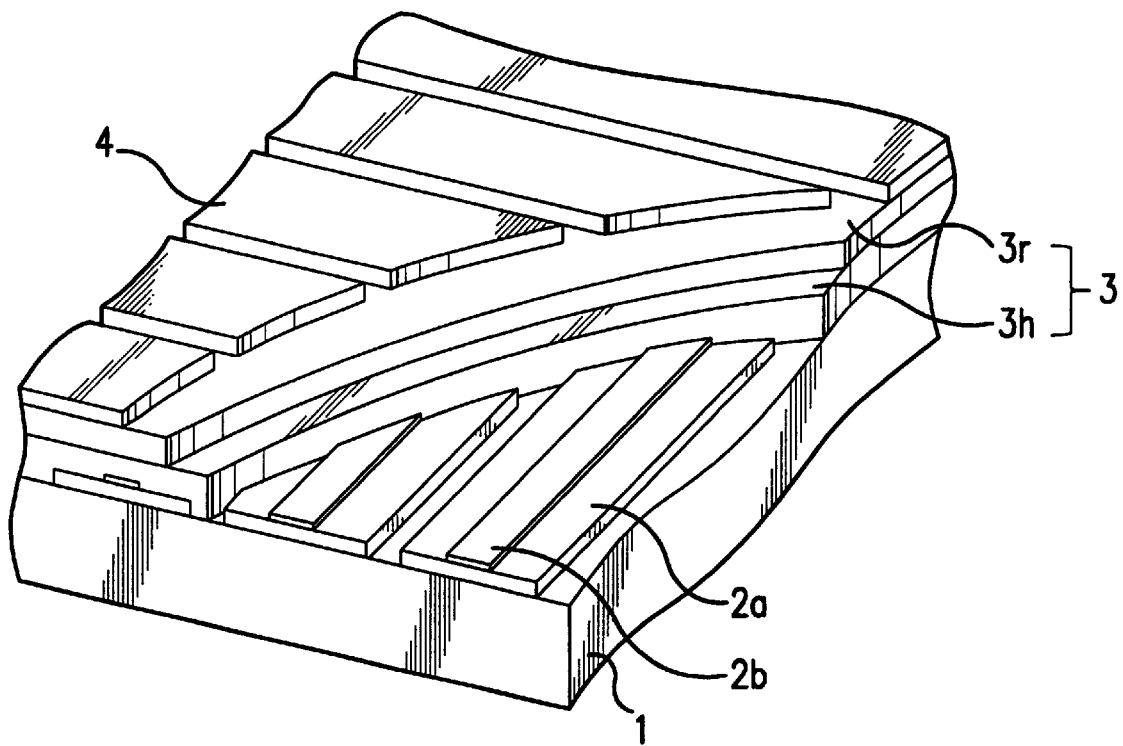
FIG. 5 is a partially broken perspective view of still another simple-matrix-type organic light-emitting device which includes a second conductor with a high work function according to the invention.

FIG. 5 is a partially broken perspective view of still another simple-matrix-type organic light-emitting device which includes a second conductor of metal with a high work function according to the invention. Since the organic light-emitting device of FIG. 5 has a structure similar to that of the organic light-emitting device of FIG. 1 except a portion around the metal second conductor, only the portion of the metal second conductor will be explained with reference to FIG. 5. In FIG. 5, a second conductor 2*b* made of metal with a work function of 4.8 eV or higher is formed between the first conductor 2*a* and the organic film laminate 3.

Ni (work function: 4.84 eV), Pd (work function: 4.82 eV), Pt (work function: 5.29 eV) and the like are used alone or in a form of an alloy as the metal material of the second conductor 2*b*.

Figure 6A:
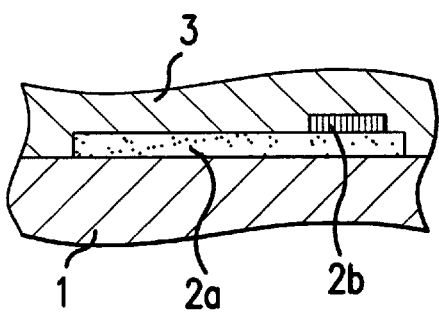
FIG. 6(a) is a cross sectional view of the anode showing another arrangement of the second conductor of FIG. 5.
Figure 6B:
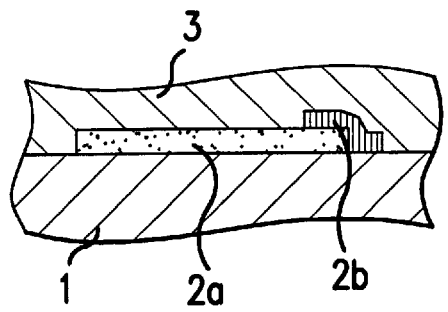
FIG. 6(b) is a cross sectional view of the anode showing still another arrangement of the second conductor of FIG. 5.

FIG. 6(*a*) is a cross sectional view of the anode showing another arrangement of the metal second conductor of FIG. 5. FIG. 6(*b*) is a cross sectional view of the anode showing still another arrangement of the metal second conductor of FIG. 5. In FIG. 6(*a*), the metal second conductor 2*b* is laminated on an edge portion of the first conductor 2*a*. In FIG. 6(*b*), the metal second conductor 2*b* is laminated partly on an edge portion of the first conductor 2*a*.

In FIGS. 6(*a*) and 6(*b*), the resistance is reduced by the metal second conductor 2*b* in the same manner as described above.

Electron injection is prevented by the difference between the work functions of the metal of the second conductor and the organic film laminate. Since the metal having a higher work function than that of the constituent material (transparent and electrically conductive material) of the anode is used, the capability of preventing hole injection is identical or superior to that of the device which does not include any additional conductor for the anode.

Since the metal second conductor is formed in such a manner that the metal second conductor is in contact with the transparent anode according to the invention, the resistance of the anode is reduced without thickening the transparent anode. Therefore, the anode surface is smooth, and defects are not caused in the organic film laminate.

Figure 7A:
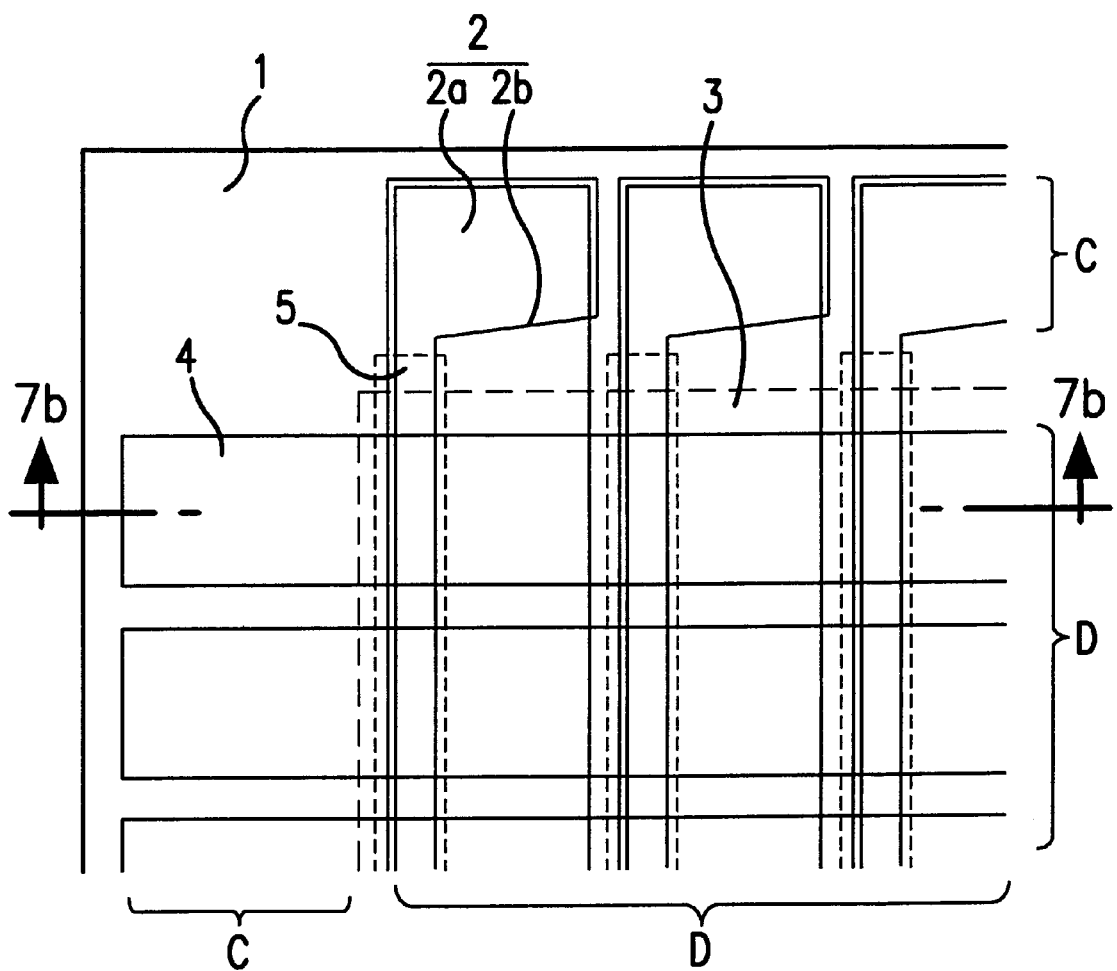
FIG. 7(a) is a top plan view of a further organic light-emitting device of simple matrix type according to the invention.
Figure 7B:
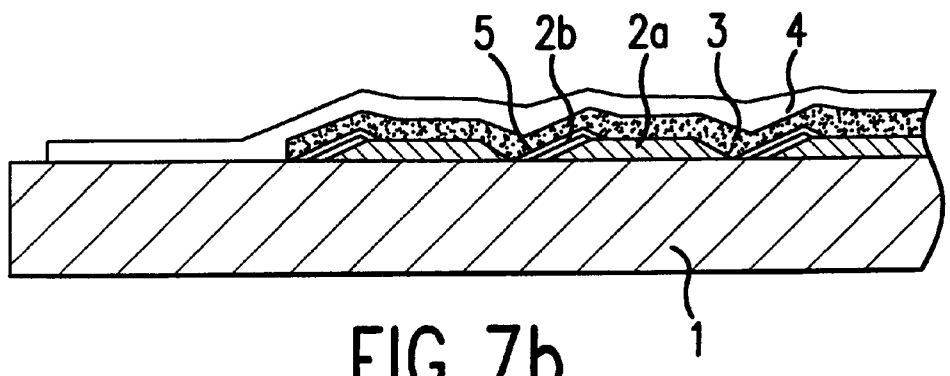
FIG. 7(b) is a cross sectional view taken along line 7(b)—7(b) in FIG. 7(a)
Figure 8A:
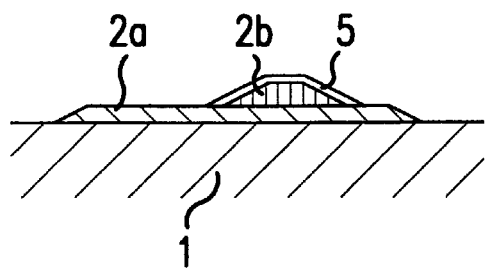
FIGS. 8(a)–8(e) are cross sectional views showing positional relationships of the second conductors in the anodes.
Figure 8B:
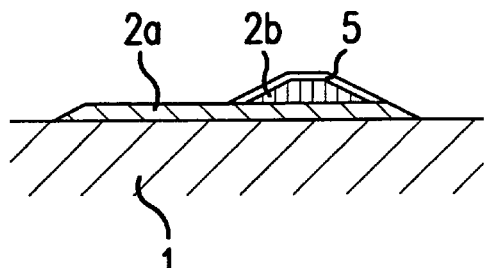
Figure 8C:
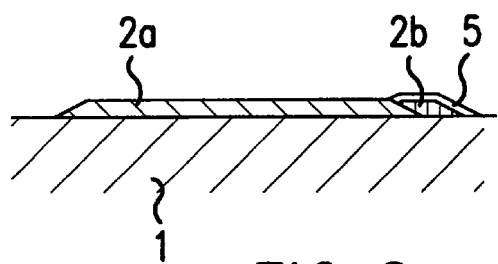
Figure 8D:
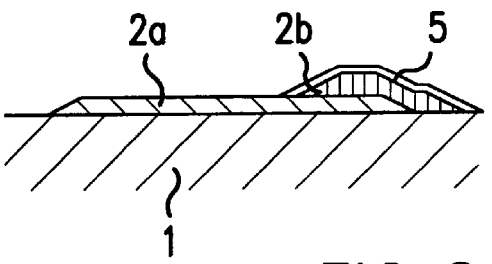
Figure 8E:
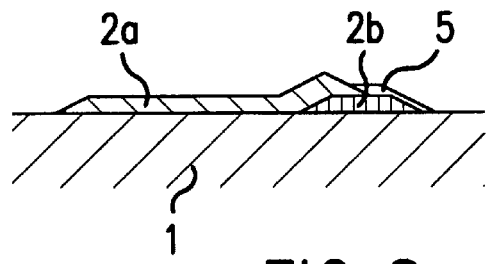

FIG. 7(*a*) is a top plan view of a further organic light-emitting device of a simple matrix type according to the invention. FIG. 7(*b*) is a sectional view taken along line 7(*b*)—7(*b*) in FIG. 7(*a*). Referring now to these figures, an anode 2 consists of a first conductor 2*a* and a second conductor 2*b*. The first conductor 2*a* is a transparent and electrically conductive film made of a metal oxide, and the second conductor 2*b* is made of at least one kind of metal. An insulation film 5 is formed at least on the surface portion, which faces an organic film laminate 3, of the second conductor 2*b*.

The anodes 2 are formed on a substrate 1. The anode 2 includes the first conductor 2*a* and the second conductor 2*b*. The first conductors 2*a*, which are transparent and electrically conductive films, are formed in a stripe pattern on the substrate 1. The second conductors 2*b* consist of metal films or strips formed in a stripe pattern extending on the strips of the first conductors 2*a*. The organic film laminate 3 is disposed on the anodes 2. Metal cathodes 4 are located on the organic film laminate 3. The cathodes 4 are formed in a stripe pattern extending perpendicularly to the strips of the anodes 2. And, as described above, the insulation film 5 is formed at least on the surface portion, facing the organic film laminate 3, of the second conductor 2*b*.

FIGS. 8(*a*)–8(*e*) are cross sectional views showing positional relationships of the second conductors in the anodes. Any positional relationship is feasible as far as the first conductor 2*a* and the second conductor 2*b* are electrically connected to each other, and the insulation film 5 is formed at least on the surface portion, facing the organic film laminate 3, of the second conductor 2*b*. The position of the second conductor 2*b* is not always limited to the illustrated examples.

One guide line for selecting the metal of the second conductor 2*b*, facing the organic film laminate via the insulation film 5, is that the difference between the work functions of the metal for the second conductor 2*b* and the transparent conductive film of the first conductor 2*a* is not so large. It is preferable that the difference between the work functions is 0.5 eV or smaller. When the work function difference exceeds 0.5 eV, unstable patterning of the metal film and the transparent conductive film is caused, and the metal film and the transparent conductive film are not shaped precisely due to the cell action caused in the development process of the photoresist or in the wet etching process of the electrode materials by the work function difference.

The work functions of ITO and IZO, used usually for the transparent conductive film, are around 5.0 eV. For ITO and IZO, it is desirable to select a metal such that the work function thereof is within the range between 4.5 and 5.5 eV. For example, Cr (work function: 4.5 eV), Ni (work function: 5.15 eV), Cu (work function: 4.65 eV), Mo (work function: 4.6 eV), W (work function: 4.6 eV) and alloys which mainly contain at least one of these metals may be used.

Figure 9:
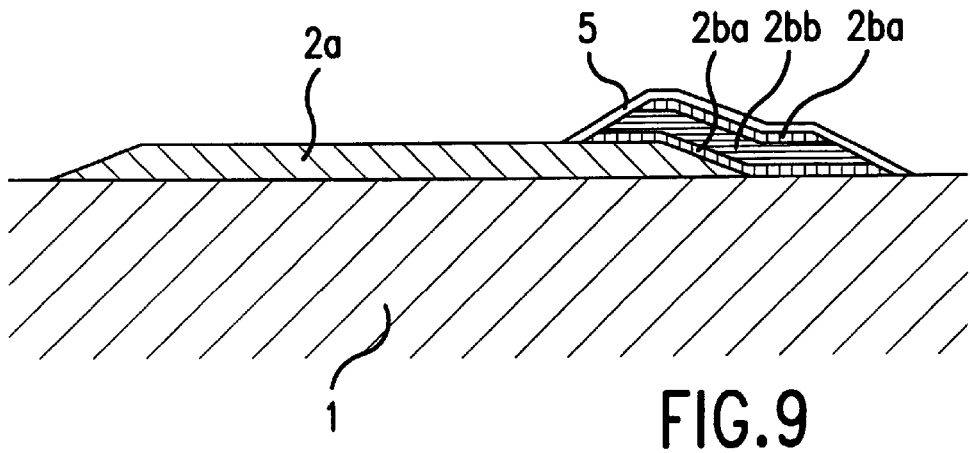
FIG. 9 is a cross sectional view showing other layer structure of the second conductor for the simple-matrix-type organic light-emitting device according to the invention.

FIG. 9 is a cross sectional view showing still another layer structure of the second conductor for a simple-matrix-type organic light-emitting device according to the invention. A second conductor 2*b* has a ternary layer structure in which metal films 2*ba* and 2*ba*, made of a first metal, are disposed on both sides of a metal film 2*bb* made of a second metal. A metal having a work function not so different from the work function of the transparent conductive film is used for the first metal. The second metal is selected arbitrarily without being restricted by the work function thereof. The throughput in the photolithographic process is improved by covering the second metal with the first metal. By using a metal with a small resistivity for the second metal, the wiring resistance is greatly reduced. Cr, Ni, Cu, Mo, W and alloys containing mainly at least one of these metals may be used for the first metal as described above, and Al, aluminum alloys, Ag, Au and Cu may be used for the second metal. It is not always necessary to select one of the metals described above for the second metal. Any material may be used for the second metal as far as the material is very effective for reducing the wiring resistance and for improving the throughput in the process. The second conductor may have a binary layer structure by omitting the first metal film on the side of the first conductor.

Inorganic oxides and organic materials are used for the insulation film 5. For example, the insulation film 5 may be formed by depositing an oxide, such as silicon oxide and alumina, on a metal film by the sputtering method or by the sol-gel method and by shaping the deposited oxide film with a desired shape, for example, by the lift-off method which uses a photoresist. Or, the insulation film 5 may be a photoresist film or an organic polymer film formed on a metal film. For forming the insulation film, it is very effective to oxidize the metal film of the second conductor by heating, by anodic oxidation, by exposing to ozone, or by treating with oxidizing liquid.

The materials for the insulation film, process for forming the insulation film, materials for the organic polymer film and methods for oxidation are not always limited to those described above. A glass substrate, a polymer film and a film-shaped substrate, a color filter and an organic film on a glass substrate may be used for the substrate.

In addition to ITO and IZO described above, tin oxide, zinc oxide and aluminum tin oxide may be used for the transparent and electrically conductive material.

A molybdenum oxide film will be described in the following first embodiment as an example of an oxide film; a binary film of indium zinc oxide and Mo is shown in the following second embodiment as another example; and a ternary film of indium zinc oxide, Al and Mo is shown in the following third embodiment as still another example.

As an example of the organic film laminate, a ternary film laminate consisting of a copper phthalocyanine layer, an N,N'-diphenyl-N,N'-bis(3 methylphenyl)-1,1'-bisphenyl-4, 4'-diamine layer, and a tris(8-quinolinol) aluminum layer will be described in the following. Al-Li will be described as the material for the cathode in some following embodiments. The materials for the organic film laminate and the materials for the cathode are not always limited to those described above.

First Embodiment

An organic light-emitting device according to the first embodiment of the invention includes a binary organic film laminate as described in FIG. 1 and metal second conductors formed at each bottom of an anode. The metal second conductors 2b were formed by depositing a Mo thin film of 100 nm in thickness by sputtering on a transparent glass substrate 1 heated at 200° C. and by pattering the Mo thin film in a stripe form of 15 μm in width by photolithography. Then, first conductors 2a were formed by depositing an ITO film of 100 nm in thickness by sputtering at a substrate temperature of 300° C. and by patterning the ITO film in a stripe form of 90 μm in width by photolithography such that the ITO film strips might extend parallel to the second conductors 2b and cover the second conductors 2b.

A binary organic film laminate was formed by depositing an organic hole transport layer 3h of N,N'-diphenyl-N,N'-bis(3 methylphenyl)-1,1'-bisphenyl-4,4'-diamine (TPD) to the thickness of 50 nm and an organic light-emitting layer 3r of tris(8-quinolinol) aluminum ($Alq_3$) to the thickness of 50 nm while keeping the substrate at a room temperature. Then, cathodes 4 were formed by depositing an Al-Li alloy film of 100 nm in thickness on the organic film laminate 3 and by patterning the Al-Li film in a stripe form of 300 μm in width extending perpendicularly to the strips of the anodes 2. Thus, a very fine organic light-emitting device having picture elements, each having 90 μm×300 μm in area, was fabricated.

The size of the glass substrate used for the organic light-emitting device of the first embodiment was 143 mm×112 mm×1.1 mm. The picture element matrix had 960×240 picture elements. The display area was 105.57 mm×79.17 mm. The strips of the anodes were divided into an upper group and a lower group.

Since the resistivity of the ITO film and the resistivity of the Mo film are $2.5 \times 10^{-4}$ Ωcm and $1.5 \times 10^{-5}$ Ωcm, respectively, and the length of the first conductor in the display area is 39.57 mm, the resistance of the second conductor according to the invention, consisting of the ITO film and the Mo film, is 2.9 kΩ between the picture element nearest to an arbitrary power supply terminal (nearest picture element) and the picture element farthest to the power supply terminal (farthest picture element). In contrast, the resistance of the single layer anode consisting only of an ITO film is 11 kΩ between the nearest picture element and the farthest picture element.

Figure 10:
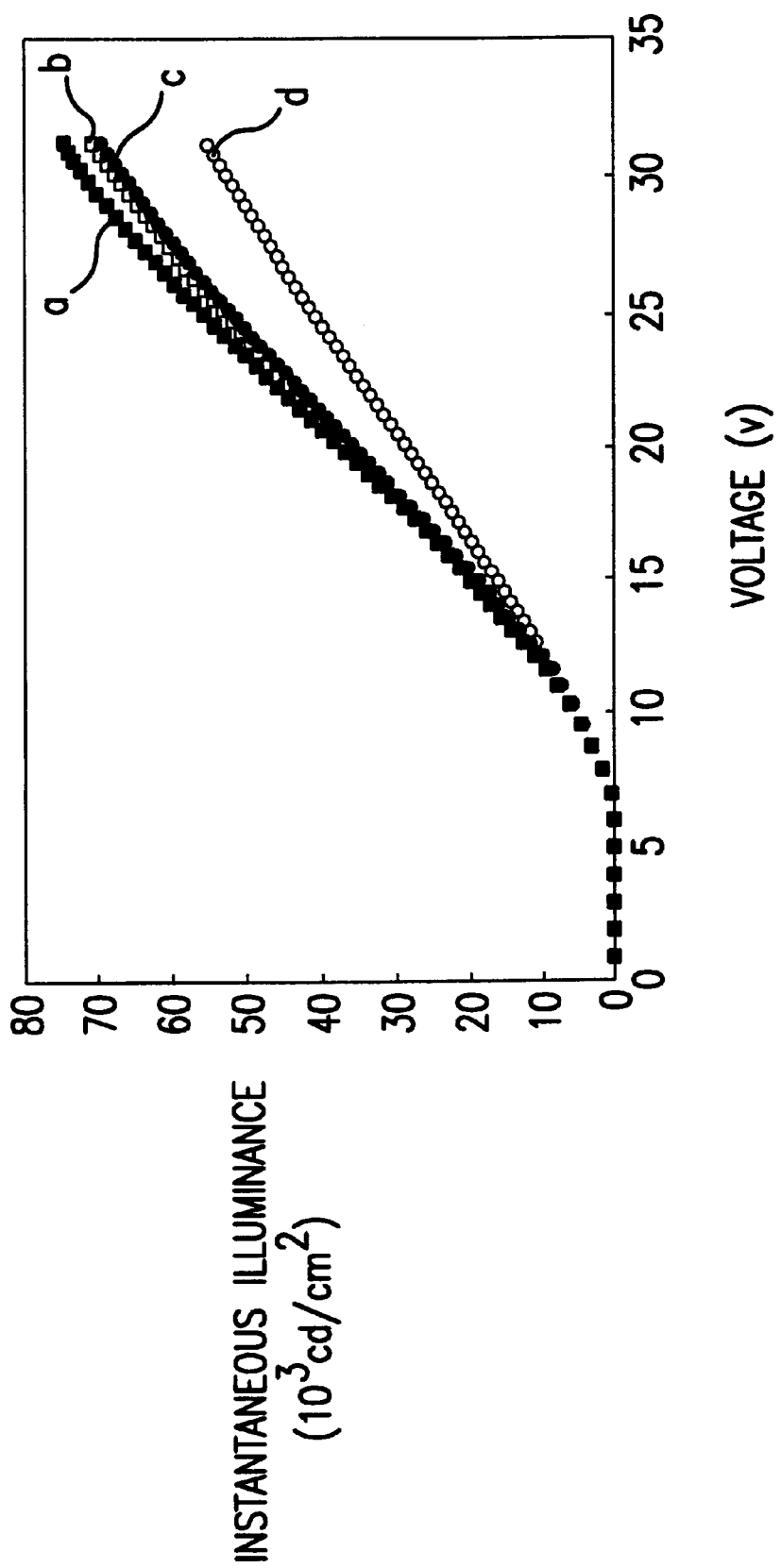
FIG. 10 is a graph showing a relation of illuminance of picture elements with applied voltage.

FIG. 10 is a graph showing a relation of the illuminance of the picture element with the applied voltage. In FIG. 10, a curve "a" is for the nearest picture element on the binary layer anode; the curve "b" is for the farthest picture element on the binary layer anode; the curve "c" is for the nearest picture element on the single layer anode; and the curve "d" is for the farthest picture element on the single layer anode. When a voltage of 20 V is applied, the illuminance of the farthest picture element drops by about 20% from that of the nearest picture element for the single layer anode consisting of the ITO film. In contrast, the illuminance of the farthest picture element drops by about 6% from that of the nearest picture element for the binary layer anode according to the invention when a voltage of 20 V is applied.

The organic light-emitting device according to the first embodiment did not emit light when a reverse bias voltage was applied, and therefore, any cross talk was not caused.

Second Embodiment

An organic light-emitting device according to a second embodiment of the invention includes a binary organic film laminate as described in FIG. 3 and metal second conductors formed on first conductors. The metal second conductors 2b were formed between the first conductors 2a and the organic hole transport layer 3h. The oxide films 2o were formed on the surfaces of the second conductors 2b by oxidizing the metal of the second conductors 2b.

In this embodiment, the second conductors 2b were formed by depositing an Al film of 120 nm in thickness by sputtering and by pattering the deposited Al film with strips of 19 μm in width. Then, the oxide films 2o were formed on the second conductors 2b by exposing the strips of the second conductors 2b to an ozone atmosphere. Since the configurations of the second embodiment except the second conductors 2b are the same as those of the first embodiment, their duplicated explanations are omitted.

Since the metal surface of the second conductor had been covered with the oxide film 2o, carrier exchange between the organic film laminate and the metal film was not caused.

Therefore, the illuminance drop of the farthest picture element was suppressed to be as low as 6% of the illuminance of the nearest picture element under the applied voltage of 20 V. The organic light-emitting device according to the second embodiment did not emit light when a reverse bias voltage was applied, and therefore, any cross talk was not caused.

Since holes are not injected from the second conductor to the organic film laminate in the structure of the second embodiment, the portion on the second conductor which is not transparent for the light does not emit light. That is, all the emitted light is radiated outside without being interrupted by the second conductor. Therefore, the external light-emitting efficiency of the organic light-emitting device according to the second embodiment is high.

Third Embodiment

An organic light-emitting device according to the third embodiment of the invention includes a binary organic film laminate as described in FIG. 3, and metal second conductors formed on first conductors. The second conductors $2b$ made of a metal and having a high work function were disposed between the first conductors $2a$ and an organic hole transport layer $3h$. The second conductors $2b$ were formed by depositing Ni having a work function of 4.84 eV to the thickness of 100 nm by sputtering and by patterning the deposited Ni film in a stripe form of 19 $\mu$m in width. Since the configurations of the third embodiment except the second conductors $2b$ are same as those of the first embodiment, their duplicated explanations are omitted.

The illuminance drop of the farthest picture element was suppressed to be as low as 6% of the illuminance of the nearest picture element under the applied voltage of 20 V. The organic light-emitting device according to the third embodiment did not emit light when a reverse bias voltage was applied, and therefore, any cross talk was not caused.

Since the work function of the metal second conductor is higher than 4.8 ev, it is not necessary to form an oxide film on the second conductor. Therefore, the process for manufacturing the organic light-emitting device according to the third embodiment is simple.

Fourth Embodiment

An organic light-emitting device having 4×4 picture elements, each having an area of 2×2 mm$^2$, was fabricated, and the carrier injection from a molybdenum oxide film and rectifying capability were evaluated.

An Mo film of 220 nm in thickness was deposited on a transparent glass substrate by sputtering at a room temperature. A positive-type photoresist (OFPR-800 supplied from Tokyo Ohka Kogyo Co., Ltd.) was coated on the Mo film by spin-coating, and four strips, each being 2 mm in width and 48 mm in length, were patterned by light exposure and by development with a developing agent (NMD-3 supplied from Tokyo Ohka Kogyo Co., Ltd.). Then, the Mo film was etched with a liquid mixture containing phosphoric acid, nitric acid and acetic acid, and then, the photoresist was peeled off.

The surface of the Mo film was oxidized by dipping the glass substrate including the Mo film formed thereon in hydrogen peroxide.

Figure 11:
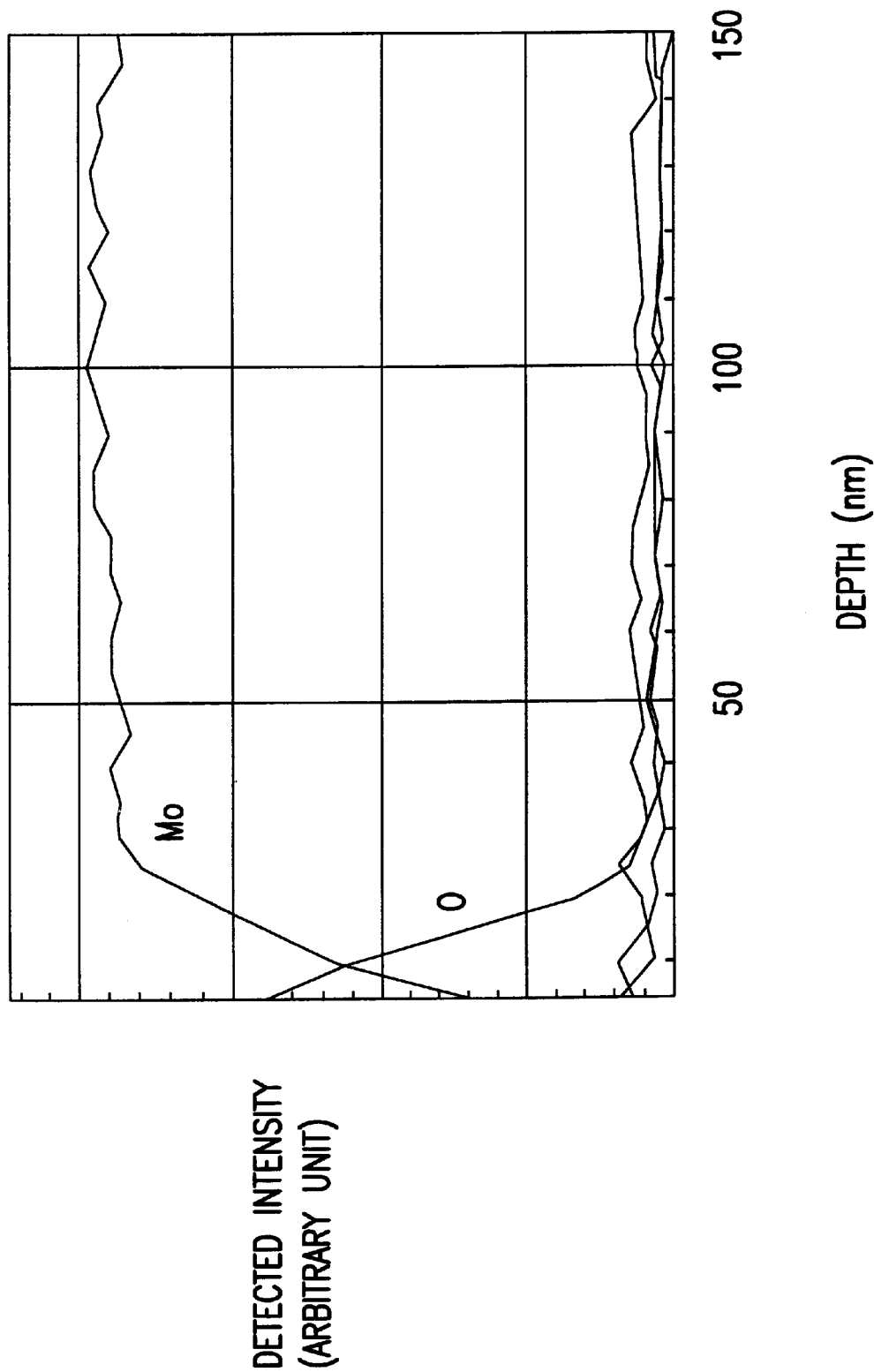
FIG. 11 shows composition distributions in the specimen, consisting of the second conductor (Mo film) and the insulation film, measured by Auger electron spectroscopy.

FIG. 11 shows composition distributions in the specimen, consisting of the second conductor (Mo film) and the insulation film, measured by Auger electron spectroscopy. As FIG. 11 clearly shows, a high-oxygen-concentration area extends for 20 nm from the surface of the specimen.

Figure 12:
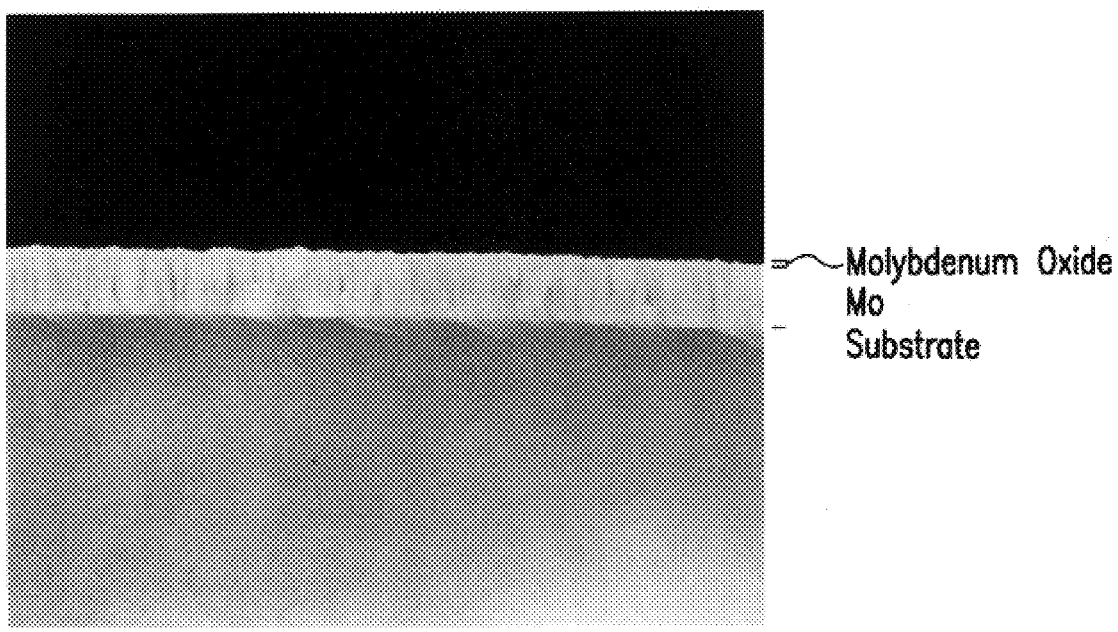
FIG. 12 is a SEM photograph showing a section of the second conductor (Mo film) and the insulation film.

FIG. 12 is a SEM micrograph showing a section of the second conductor (Mo film) and the insulation film. As FIG. 12 clearly shows, the molybdenum oxide film uniformly covers the surface of the Mo film.

A ternary organic film laminate was formed by depositing an organic hole injection layer of copper phthalocyanine and tris(8-quinolinol) aluminum copper phthalocyanine, an organic hole transport layer of N,N'-diphenyl-N,N'-bis(3 methylphenyl)-1,1'-bisphenyl-4,4'-diamine (TPD) and an organic light-emitting layer of tris(8-quinolinol) aluminum. Then, two cathode strips were formed perpendicularly to the anode strips by using a MgAg alloy (10:1 in volume ratio).

Figure 13:
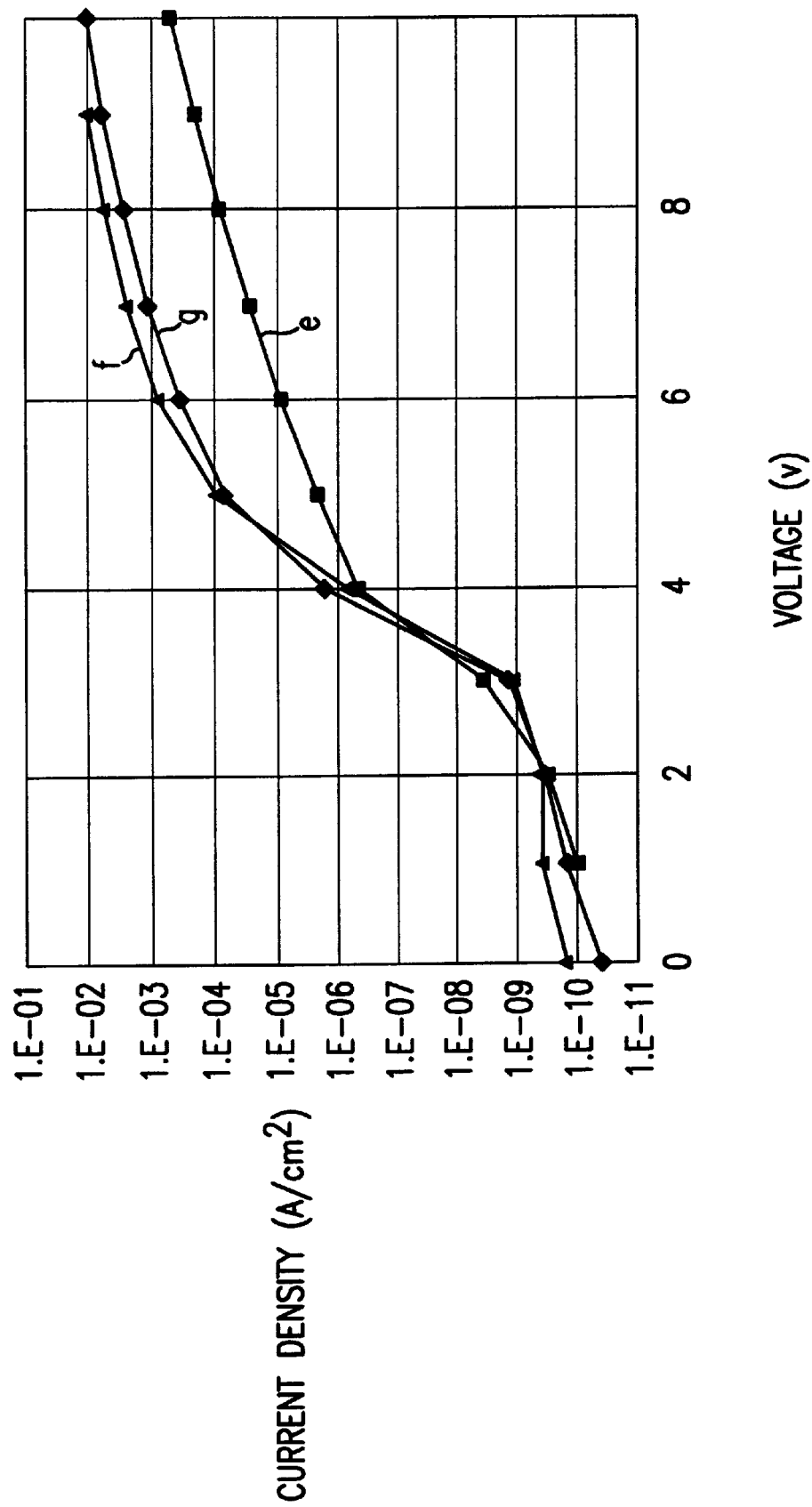
FIG. 13 is a graph showing a relation of current density in the organic light-emitting device with applied voltage

FIG. 13 is a graph with a set of curves showing a relation of the current density in the organic light-emitting device with the applied voltage. In FIG. 13, a curve "e" is for the organic light-emitting device according to the fourth embodiment; a curve "lf" is for a comparative device 1; and a curve "g" is for a comparative device 2. The comparative device 1 used IZO for the anode, and the anode of the comparative device 2 had an additional Mo film and the surface thereof had not been treated with hydrogen peroxide.

When the Mo film, not treated with hydrogen peroxide, is used, the current density, i.e. amount of the injected carrier, is almost the same as the amount of the carrier injected through the IZO film. By oxidizing the Mo film surface, the injected carrier amount at 5 V or higher decreases to $\frac{1}{25}$ relative to the amount of the carrier injected through the IZO film.

Carriers are hardly injected through any of these anode films when a reverse bias voltage is applied, and excellent rectifying capability has been confirmed.

Fifth Embodiment

A display panel having 960×240 picture elements with a pitch of 110×330 $\mu$m, and a display area of 5 inches in diagonal length was fabricated. The display area was divided into an upper area and a lower area. One anode strip cover 120 picture elements.

Figure 14A:
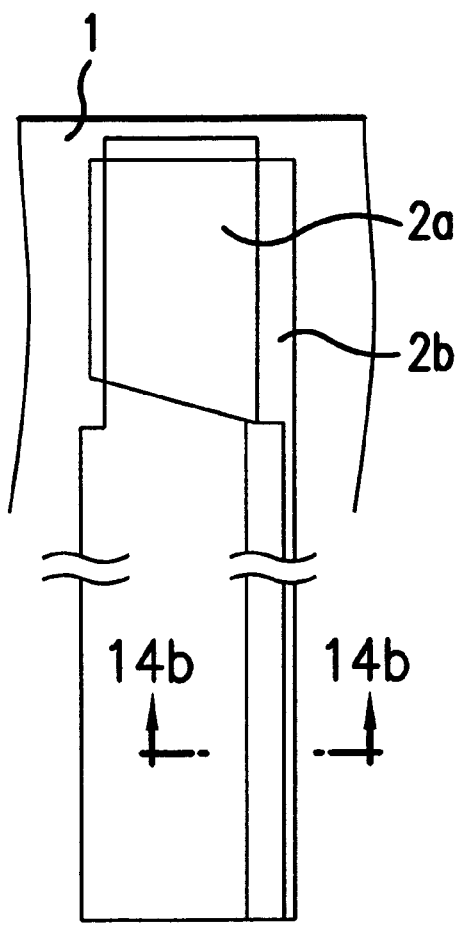
FIG. 14(a) is a top plan view showing a shape of the organic light-emitting device according to a fifth embodiment of the invention.
Figure 14B:
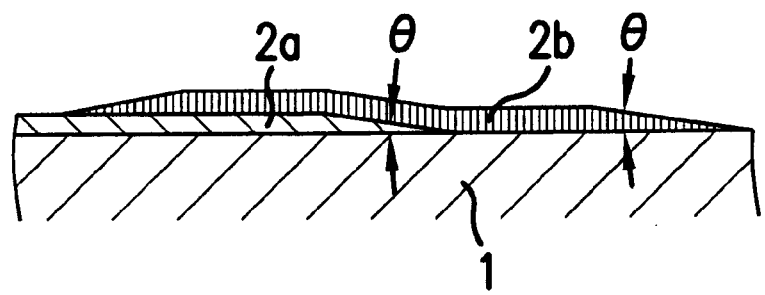
FIG. 14(b) is a sectional view taken along line 14(b)—14(b) in FIG. 14(a)

FIG. 14($a$) is a top plan view showing the shape of the organic light-emitting device according to the fifth embodiment. FIG. 14($b$) is a sectional view taken along line 14($b$)—14($b$) in FIG. 14($a$).

A first conductor $2a$ of 200 nm in film thickness was formed on a transparent glass substrate 1 at a room temperature by depositing an IZO transparent conductive film by sputtering. A positive-type photoresist (OFPR-800 supplied from Tokyo Ohka Kogyo Co., Ltd.) was coated on the IZO film by spin-coating, and strips with 42 mm in length and 96 $\mu$m in width in the display area, and 13 mm in length and 70 $\mu$m in width in the connection area were patterned by light exposure and by development with a developing agent (NMD-3 supplied from Tokyo Ohka Kogyo Co., Ltd.). Then, first conductors $2a$ were formed by etching with hydrochloric acid and by peeling off the photoresist. As an angle $\theta$ of the edge portion, contacting the substrate, of the first conductor $2a$ is sharper, the electric field in the organic film laminate concentrates lesser. Also, it is possible to effectively prevent water and oxygen from penetrating into the device from outside during sealing of the device.

An Mo film of 220 nm in thickness was deposited on the first conductors $2a$ by sputtering at a room temperature. The measured work function of the Mo film was 4.6 eV. A positive-type photoresist was coated on the Mo film by spin-coating, and the strips for the second conductors $2b$ were patterned by light exposure and by development. Then, the second conductors $2b$ were formed by etching the Mo film with a liquid mixture containing phosphoric acid, nitric acid and acetic acid, and then, by peeling off the photoresist. The width of the second conductor $2b$ in the display area was 16 $\mu$m. The metal film was extended to the connection area.

Then, the substrate was dipped into hydrogen peroxide, and an insulation film 5 was formed by oxidizing the Mo film surface.

Finally, an organic film laminate and cathodes were formed on the substrate in the same manner as in the fourth embodiment.

The wiring resistance between the connection portion and the farthest picture element on a strip of the anode according to the fifth embodiment was compared with the wiring resistance of the anode consisting only of a transparent conductive film. A specimen for resistance measurement was prepared by connecting an electrolytic copper foil, on the surface of which Ni-Au layers had been plated at a pitch of 110 $\mu$m, to the connection portion side of the anode with an anisotropic conductive tape (AC7201 supplied from Hitachi Chemical Co., Ltd.). The resistance of the specimen was measured, and the resistance of the electrolytic copper foil and the resistance of the anisotropic conductive tape were subtracted from the resistance of the specimen to obtain the wiring resistance of the anode. Results are listed in Table 1.

It has been confirmed in advance that the Mo film of 20 nm in thickness formed on the connection portion of the anode is not so hazardous for connecting the electrolytic copper foil therewith. Therefore, it is not necessary to cover the connection portion of the anode with a photoresist before oxidizing the metal of the second conductor.

TABLE 1

| Structure of the anode | Wiring resistance ($\Omega$) |
| --- | --- |
| IZO film only | 21000 |
| IZO film + Mo film | 3600 |

Thus, it has been confirmed that the wiring resistance of the anode including a metal film is about 17% of the wiring resistance of the anode consisting only of a transparent conductive film.

Figure 15:
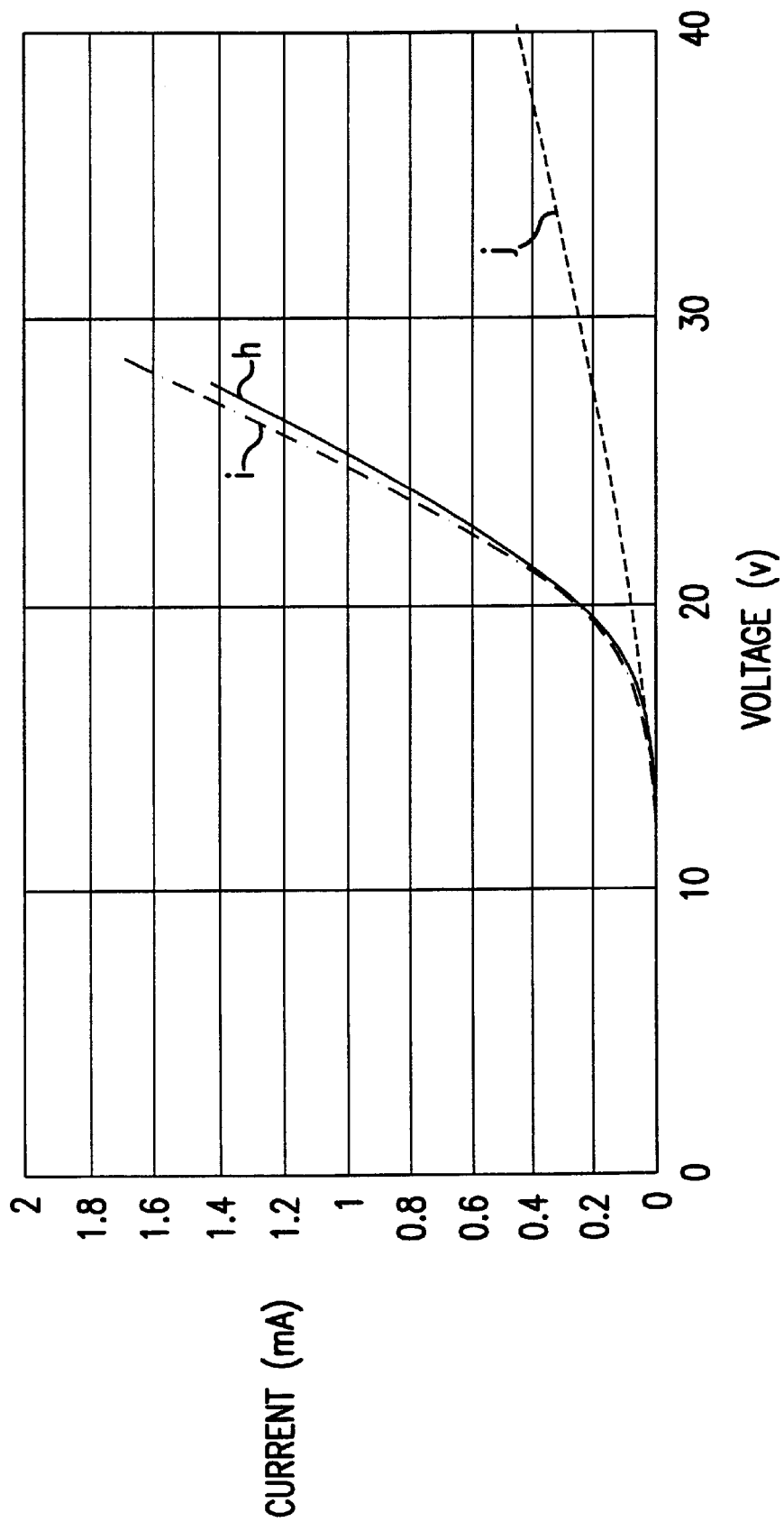
FIG. 15 is a graph showing a relation of current in the organic light-emitting device with applied voltage of the fifth embodiment of the invention.

FIG. 15 is a graph with a set of curves showing a relation of current with applied voltage of the organic light-emitting device. In FIG. 15, a curve "h" is for the organic light-emitting device according to the fifth embodiment; a curve "i" is for a comparative device fabricated in the same manner as the device of the fifth embodiment except that the Mo film of 200 nm in thickness was not oxidized; and a curve "j" is for another comparative device, the anode thereof consisting only of a transparent conductive film.

It has been confirmed that the organic light emitting device, which has the anode with the transparent conductive film and the metal film, emits brighter light at a lower drive voltage than the device having the anode consisting only of a transparent conductive film, and that the organic light emitting device, the surface of the Mo film having been oxidized, emits brighter light at a smaller current than the device where the Mo film has not been oxidized. Light emission loss is caused when the light emitted by the electron injection from the Mo film to the organic film laminate can not radiate outside. The foregoing results indicate that such the light emission loss is reduced by the anode structure of the fifth embodiment.

Table 2 lists the power consumption when the organic light-emitting device emits light at an aerial illuminance of 100 cd/m$^2$ by a passive matrix drive at a duty ratio of $\frac{1}{120}$ and at a frame frequency of 60 Hz. When the power consumption by the organic light-emitting device according to the fifth embodiment is regarded as 1, the power consumption by the comparative device fabricated in the same manner as the device of the fifth embodiment except that the Mo film of 200 nm in thickness was not oxidized is about 1.2, and the power consumption by the comparative device with the anode consisting only of a transparent conductive film is about 1.6.

TABLE 2

| Structure of the anode | Relative power consumption |
| --- | --- |
| IZO film only | 1.6 |
| IZO film + Mo film | 1.2 |
| IZO film + Mo film + oxide film | 1 |

Sixth Embodiment

First conductors were formed by depositing an IZO film on a transparent glass substrate. Second conductors were formed on this glass substrate by depositing an Mo film of 50 nm in thickness, an Al film of 200 nm in thickness and another Mo film of 50 nm in thickness by sputtering; by coating a positive-type photoresist on the metal film laminate by spin-coating; by exposing the metal film laminate with the photoresist coated thereon; and by developing a stripe pattern, same as that of the fifth embodiment (cf. FIGS. 14 and 9) with a developing agent. The width of the second conductor in the display area is 16 $\mu$m, and the second conductor is extended to the connection area of the external signal line.

The Mo film was etched with a liquid mixture containing phosphoric acid, nitric acid and acetic acid, and then, the photoresist was peeled off. The surface of the Mo film was oxidized by dipping the glass substrate including the Mo film in hydrogen peroxide.

Finally, an organic film laminate and cathodes were formed on the substrate in the same manner as in the fourth embodiment.

The wiring resistance between the connection portion and the farthest picture element on a strip of the anode according to the sixth embodiment was measured in the same manner as in the fifth embodiment and compared with the wiring resistance of the anode consisting only of a transparent conductive film and the wiring resistance of the anode according to the fifth embodiment. Table 3 lists the results.

TABLE 3

| Structure of the anode | Wiring resistance ($\Omega$) |
| --- | --- |
| IZO film only | 21000 |
| IZO film + Mo film + oxide film | 3600 |
| IZO film + Mo & Al films + oxide film | 1000 |

The additional film of Al with small resistivity is very effective to reduce the wiring resistance. It has been confirmed that the wiring resistance of the quaternary film anode is about 5% of the wiring resistance of the anode consisting only of the IZO film.

Figure 16:
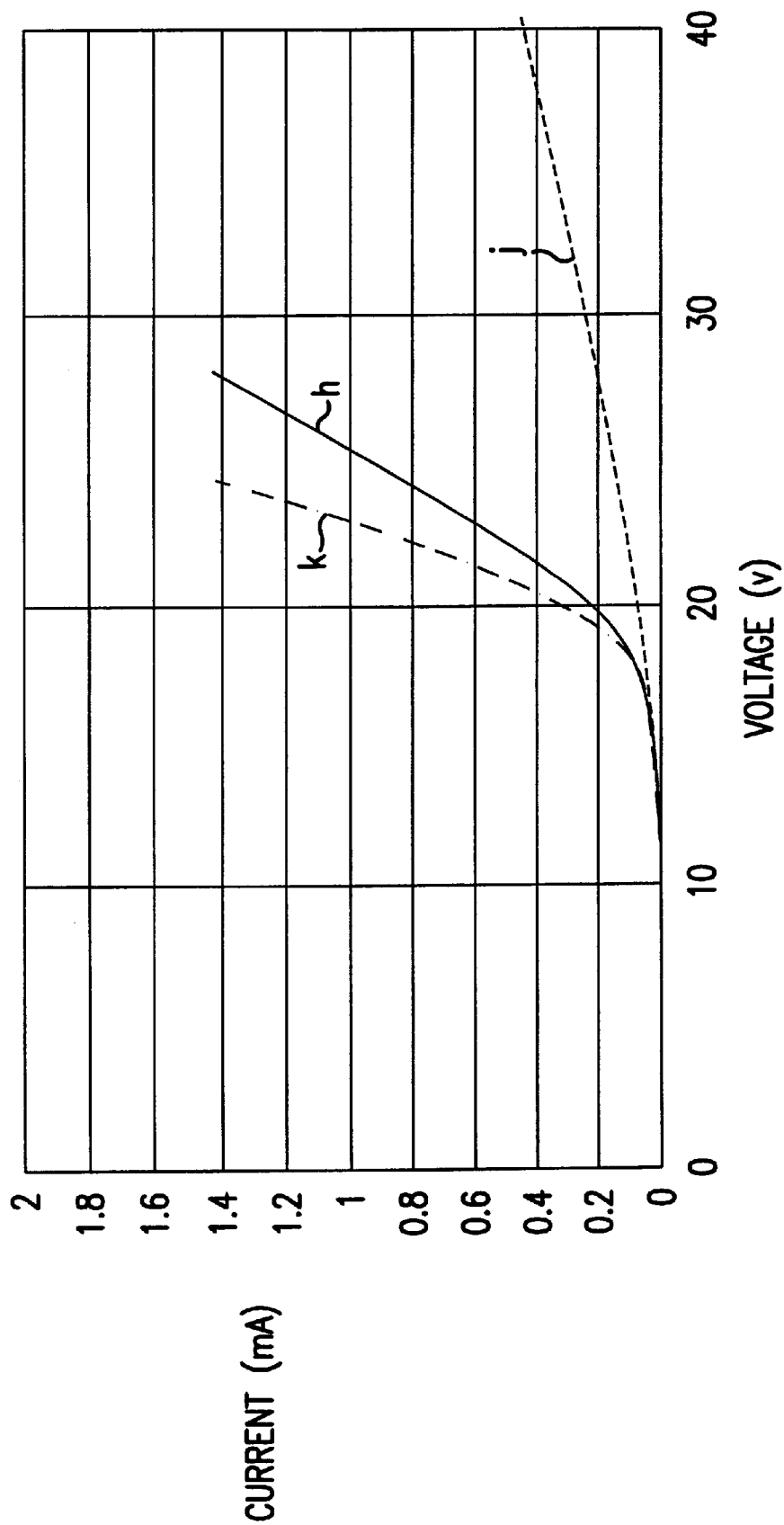
FIG. 16 is another graph showing a relation of current in the organic light-emitting device with applied voltage of a sixth embodiment of the invention.
Figure 17A:
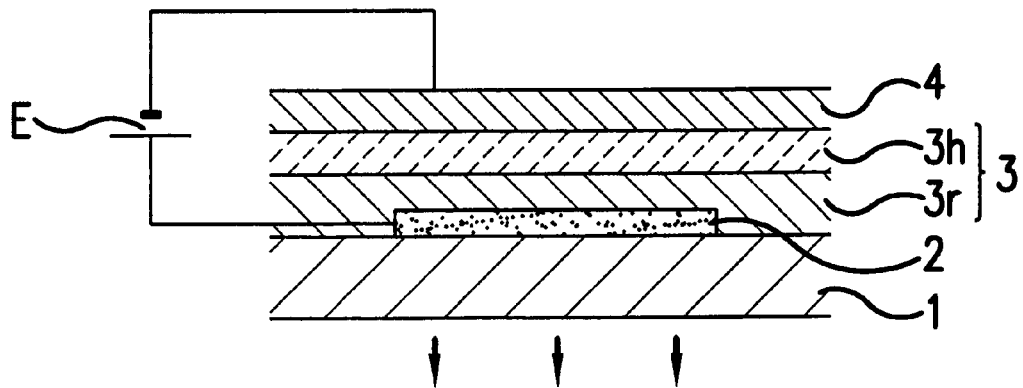
FIG. 17(a) is an explanatory cross sectional view of a conventional organic light-emitting device including a binary organic film laminate.
Figure 17B:
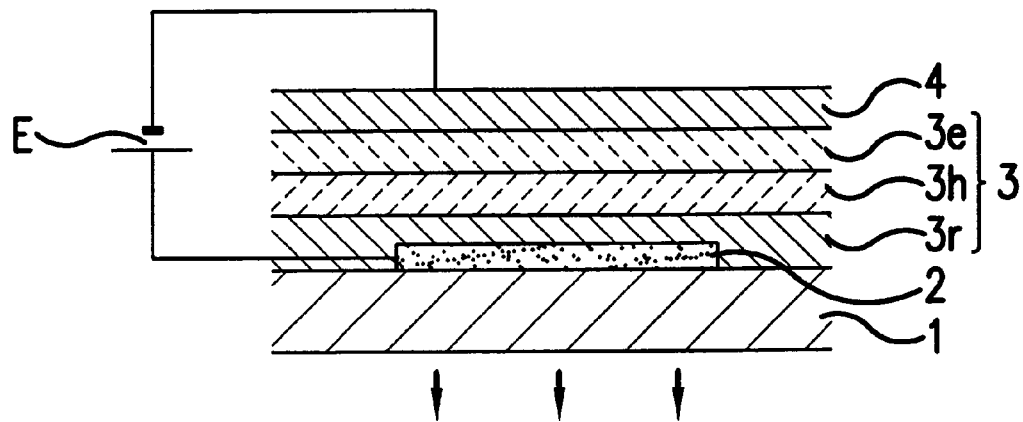
FIG. 17(b) is an explanatory cross sectional view of another conventional organic light-emitting device including a ternary organic film laminate.
Figure 18A:
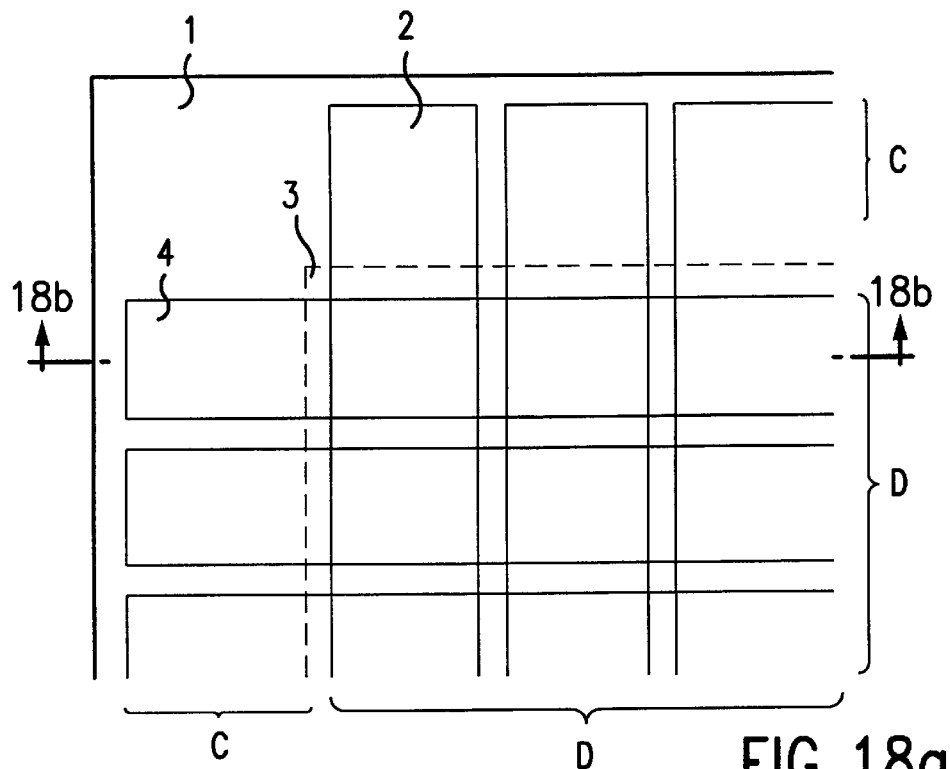
FIG. 18(a) is a top plan view of a conventional organic light-emitting device of a simple matrix type
Figure 18B:
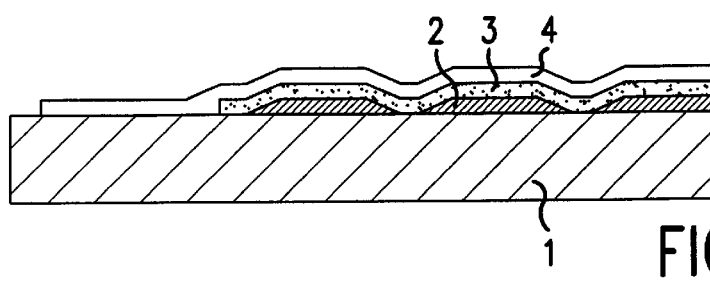
FIG. 18(b) is a cross sectional view taken along line 18(b)—18(b) in FIG. 18(a)
Figure 18C:
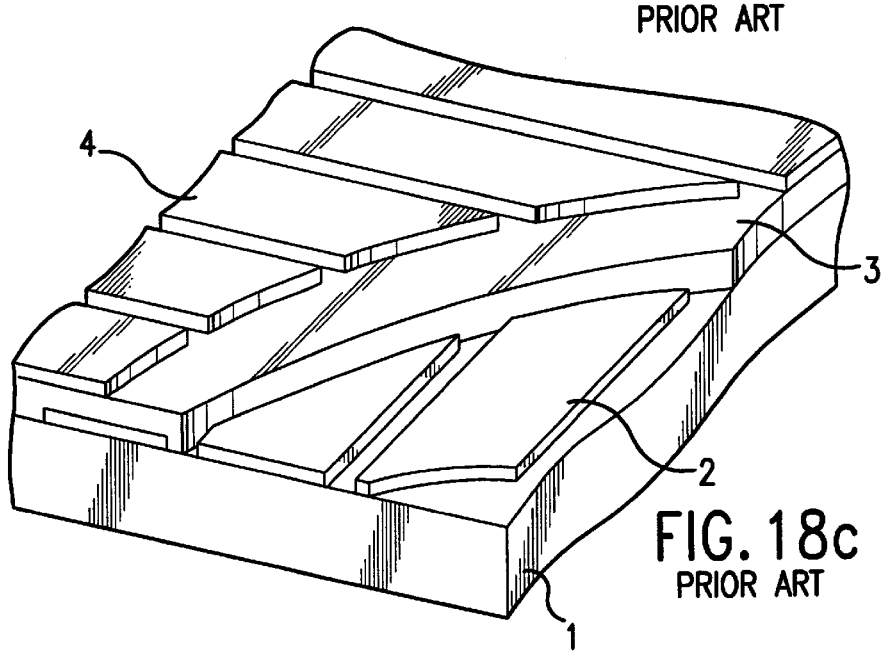
FIG. 18(c) is a partly-broken perspective view of a conventional organic light-emitting device of FIG. 18(a).

FIG. 16 is a graph of another set of curves showing a relation of current with applied voltage in the organic light-emitting device. In FIG. 16, a curve "k" is for the organic light-emitting device according to the sixth embodiment; a curve "j" is for the comparative device with the anode consisting only of a transparent conductive film; and a curve "h" is for the organic light-emitting device according to the fifth embodiment. It has been confirmed that the organic light emitting device according to the sixth embodiment emits brighter light at a lower drive voltage than that for the organic light emitting device according to the fifth embodiment.

The power consumption of the organic light emitting device according to the sixth embodiment was measured in the similar manner as in the fifth embodiment. When the power consumption by the organic light-emitting device according to the sixth embodiment is regarded as 1, the power consumption by the organic light-emitting device according to the fifth embodiment having the anode of the IZO film, Mo film and oxide film is about 1.3, and the power consumption by the comparative device having the anode consisting only of a transparent conductive film is about 1.7. Table 4 lists the results.

TABLE 4

| Structure of the anode | Relative power consumption |
| --- | --- |
| IZO film only | 1.7 |
| IZO film + Mo film + oxide film | 1.3 |
| IZO film + Mo & Al films + oxide film | 1 |

Seventh Embodiment

The organic light-emitting device of the seventh embodiment was fabricated in the similar manner as the devices of the fifth and sixth embodiments except that the Mo film of the seventh embodiment contained 2 weight % of wolfram. Hereinafter, the Mo film according to the seventh embodiment will be referred to as the "Mo-2w % W film".

The wiring resistance of an anode strip between the connection portion and the farthest picture element was measured, and compared with the wiring resistance of the anode consisting only of a transparent conductive film. The results are listed in Table 5.

TABLE 5

| Structure of the anode | Wiring resistance ($\Omega$) |
| --- | --- |
| IZO film only | 21000 |
| IZO film + Mo-2w % W film + oxide film | 6400 |
| IZO film + Mo-2w % W & Al films + oxide film | 1100 |

Since the resistivity of Mo-2w % W is twice as high as that of Mo, wiring resistance reduction by the Mo-2w % W film is less effective than the resistance reduction according to the fifth and sixth embodiments. When an Al film is sandwiched between the Mo-2w % W films, the wiring resistance is almost the same as that of the device of the sixth embodiment in which the Al film is sandwiched between the Mo films.

The power consumption of the device of the seventh embodiment was measured and compared with the power consumption of the device of the fifth embodiment. Results are listed in Table 6.

TABLE 6

| Structure of the anode | Relative power consumption |
| --- | --- |
| IZO film only | 1.7 |
| IZO film + Mo-2w % W film + oxide film | 1.3 |
| IZO film + Mo-2w % W & Al films + oxide film | 1 |

Thus, it has been confirmed that the light emission loss and power consumption are reduced by disposing a metal film and by forming an oxide film on the metal film.

The organic light-emitting device according to one aspect of the invention includes a transparent substrate and a laminate on the transparent substrate, the laminate including anodes, an organic film layer and cathodes, wherein the anode includes a first conductor consisting of a transparent conductive film containing an metal oxide as its main component and a second conductor made of metal, the resistivity thereof being 1/10 or less than the resistivity of the constituent materials of the first conductor. The second conductor is interposed between the substrate and the first conductor or between the first conductor and the organic film laminate, and the surface of the second conductor on the side of the organic film laminate is covered with an oxide film such that the second conductor does not contact the organic film laminate. This device structure lowers the resistance of the anode, prevents illuminance from lowering along the strip of the second conductor, and facilitates improving the image quality. Since electrons are not injected from the second conductor to the organic film laminate when a reverse bias voltage is applied, any cross talk is not caused.

By interposing the second conductor having a work function of 4.8 eV or higher between the first conductor and the organic film laminate, the resistance of the anode is reduced in the same manner as described above, the electron injection to the organic film laminate is prevented due to the high work function, and any cross talk is not caused.

When the second conductor includes an oxide film, hole injection from the second conductor to the organic film laminate is also prevented. Therefore, the portion of the organic film laminate covered with the second conductor does not contribute to the light emission. Since any current does not flow through the portion covered with the second conductor, the external light emission efficiency is higher than that of the other structures.

The organic light-emitting device according to another aspect of the invention includes a transparent substrate and a laminate on the transparent substrate, the laminate including anodes, an organic film laminate, and cathodes, wherein the anode includes a first conductor consisting of a transparent conductive film containing a metal oxide as its main component, a second conductor including at least one metal film in contact with the first conductor and an oxide film interposed between the second conductor and the organic film laminate. Since the second conductor reduces the resistance (wiring resistance) of the anode and the oxide film prevents charge injection from the second conductor to the organic film laminate, the organic light-emitting device according to the invention can be driven with a low voltage and the power consumption per unit illuminance is reduced.

By setting a difference between the work function of the material for the first conductor and the work function of the metal for the metal film, which is positioned most closely to the organic film laminate of the second conductor, within 0.5 eV, the cell effect caused by the work function difference during the patterning process of the anode is reduced, precision of patterning the anode including the second conductor is improved, and the throughput of manufacturing the organic light emitting device is raised.

What is claimed is:

1. An organic light-emitting device comprising:
    a transparent substrate;
    anodes in a stripe pattern formed on said transparent substrate, each of said anode including a first conductor formed of a transparent and electrically conductive film containing a metal oxide as a main component, and a second conductor extending along the first conductor and being formed of a metal with a resistivity of at most $\frac{1}{10}$ of a resistivity of a constituent material of said first conductor;

an organic film layer formed on said anodes; and cathodes formed on said organic film layer.

2. An organic light-emitting device according to claim 1, wherein said second conductor is formed between said transparent substrate and said first conductor.

3. An organic light-emitting device according to claim 1, wherein said second conductor is formed between said first conductor and said organic film layer, and includes a surface covered with a metal oxide film on a side of said organic film layer.

4. An organic light-emitting device according to claim 3, wherein said metal oxide film is an oxidation product of said second conductor.

5. An organic light-emitting device according to claim 1, wherein said second conductor is located between said first conductor and said organic film layer, said second conductor being formed of a metal and having a work function at least 4.8 eV.

6. An organic light-emitting device comprising:

anodes in a stripe pattern, each of said anodes including a first conductor formed of a transparent and electrically conductive film containing a metal oxide as a main component, and a second conductor formed of at least one metal film and attached to the first conductor;

an insulation film mounted on the second conductor;

an organic film layer disposed over the anodes, said insulation film being interposed between the organic film layer and the second conductor; and cathodes formed on the organic film layer.

7. An organic light-emitting device according to claim 6, wherein said second conductor is a laminate comprising a plurality of metal films.

8. An organic light-emitting device according to claim 6, wherein a difference between a work function of a material constituting the first conductor and a work function of a metal of a metal film positioned most closely to the organic film layer in the second conductor is at most 0.5 eV.

9. An organic light-emitting device according to claim 6, wherein said insulation film is an oxide film of the material constituting said second conductor.

\* \* \* \* \*